(12) United States Patent
Shih et al.

(10) Patent No.: US 10,879,250 B2
(45) Date of Patent: Dec. 29, 2020

(54) SEMICONDUCTOR STRUCTURE FOR MEMORY DEVICE AND METHOD FOR FORMING THE SAME

(71) Applicant: TAIWAN SEMICONDUCTOR MANUFACTURING COMPANY LTD., Hsinchu (TW)

(72) Inventors: Hung-Ling Shih, Tainan (TW); Yong-Shiuan Tsair, Tainan (TW); Po-Wei Liu, Tainan (TW); Wen-Tuo Huang, Tainan (TW); Yu-Ling Hsu, Tainan (TW); Chieh-Fei Chiu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 73 days.

(21) Appl. No.: 15/689,598

(22) Filed: Aug. 29, 2017

(65) Prior Publication Data

US 2019/0067305 A1   Feb. 28, 2019

(51) Int. Cl.
| | |
|---|---|
| *H01L 27/11517* | (2017.01) |
| *H01L 29/78* | (2006.01) |
| *H01L 29/06* | (2006.01) |
| *H01L 21/8234* | (2006.01) |
| *H01L 29/51* | (2006.01) |
| *H01L 29/423* | (2006.01) |
| *H01L 27/11521* | (2017.01) |

(52) U.S. Cl.
CPC ............ *H01L 27/11517* (2013.01); *H01L 21/823481* (2013.01); *H01L 27/11521* (2013.01); *H01L 29/0649* (2013.01); *H01L 29/42328* (2013.01); *H01L 29/513* (2013.01); *H01L 29/7831* (2013.01)

(58) Field of Classification Search
CPC ....... H01L 27/11517; H01L 21/823481; H01L 29/0649; H01L 29/513; H01L 29/7831
USPC ......................................................... 257/320
See application file for complete search history.

(56) References Cited

U.S. PATENT DOCUMENTS

| | | | | |
|---|---|---|---|---|
| 5,158,902 | A * | 10/1992 | Hanada | H01L 27/105 438/258 |
| 5,889,305 | A * | 3/1999 | Choi | H01L 27/105 257/316 |
| 2003/0205751 | A1* | 11/2003 | Kimura | H01L 27/10808 257/306 |
| 2004/0256657 | A1* | 12/2004 | Hung | H01L 27/115 257/315 |
| 2005/0199945 | A1* | 9/2005 | Kodama | H01L 27/115 257/324 |

(Continued)

*Primary Examiner* — Ori Nadav
(74) *Attorney, Agent, or Firm* — WPAT, P.C., Intellectual Property Attorneys; Anthony King

(57) ABSTRACT

A method for forming a semiconductor structure includes providing a substrate including a plurality of first isolation structures formed therein, wherein the first isolation structures are protruded from a surface of the substrate; conformally forming a semiconductor layer over the substrate and the first isolation structures; forming a sacrificial layer over the semiconductor layer to form a planar surface over the substrate; and removing the sacrificial layer, a portion of the semiconductor layer and a portion of each first isolation structure to form at least one first gate structure using a same etchant.

20 Claims, 8 Drawing Sheets

(56) References Cited

U.S. PATENT DOCUMENTS

| | | | |
|---|---|---|---|
| 2006/0163559 A1* | 7/2006 | Koganei | H01L 51/0021 257/40 |
| 2008/0248620 A1* | 10/2008 | Liu | H01L 21/28273 438/257 |
| 2010/0025667 A1* | 2/2010 | Liu | H01L 51/0533 257/40 |
| 2014/0103409 A1* | 4/2014 | Kakehata | H01L 21/76254 257/290 |
| 2015/0194299 A1* | 7/2015 | Ahn | C23C 16/308 438/584 |
| 2016/0201187 A1* | 7/2016 | Yano | H01L 29/78609 204/298.13 |

* cited by examiner

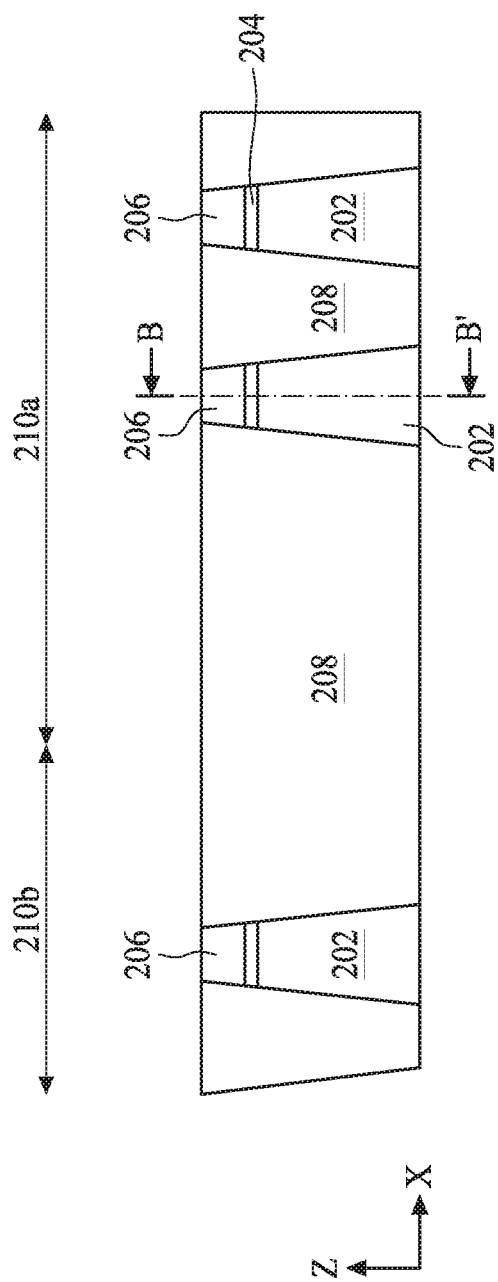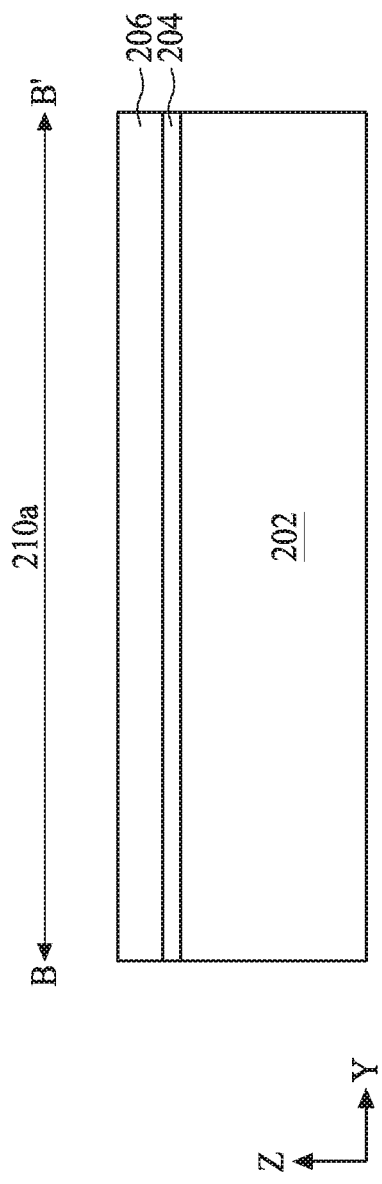
FIG. 2A
FIG. 2B

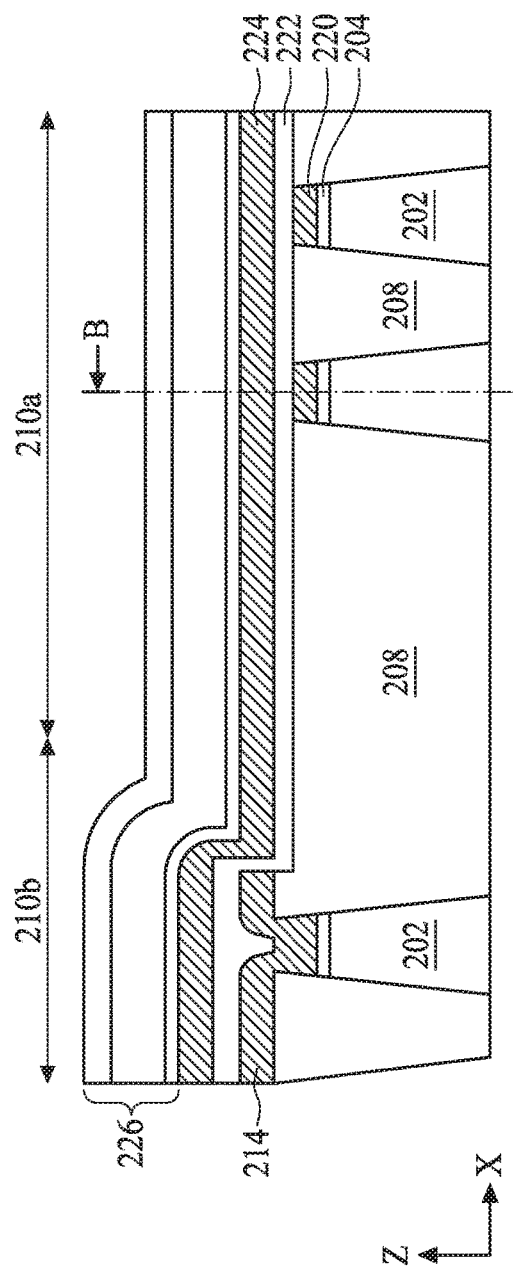
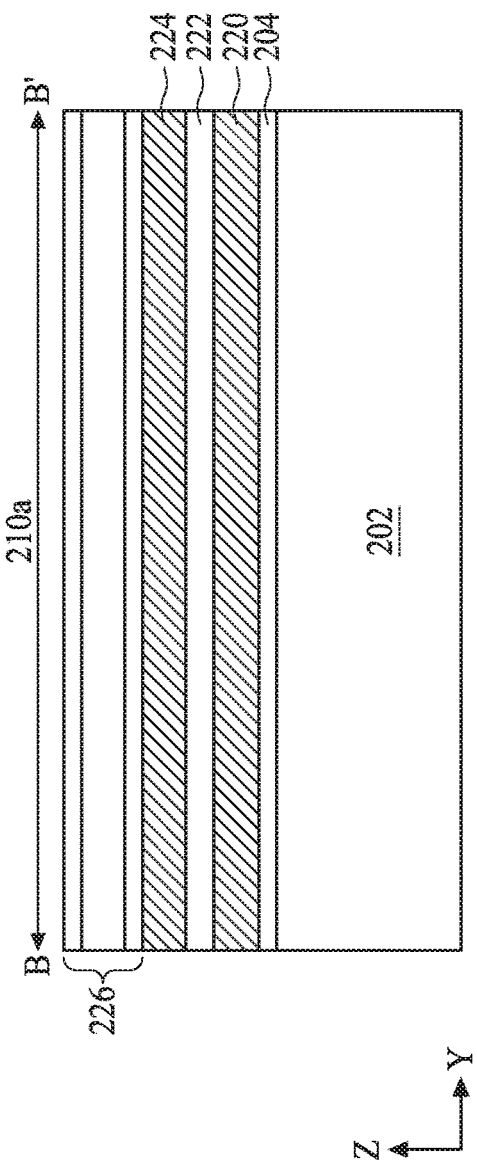
FIG. 6A
FIG. 6B

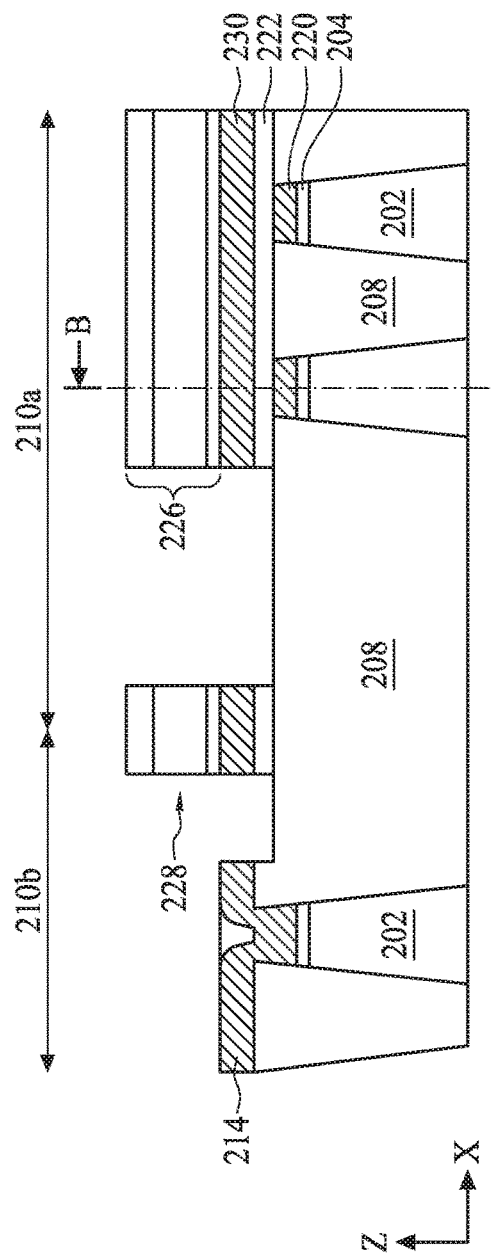
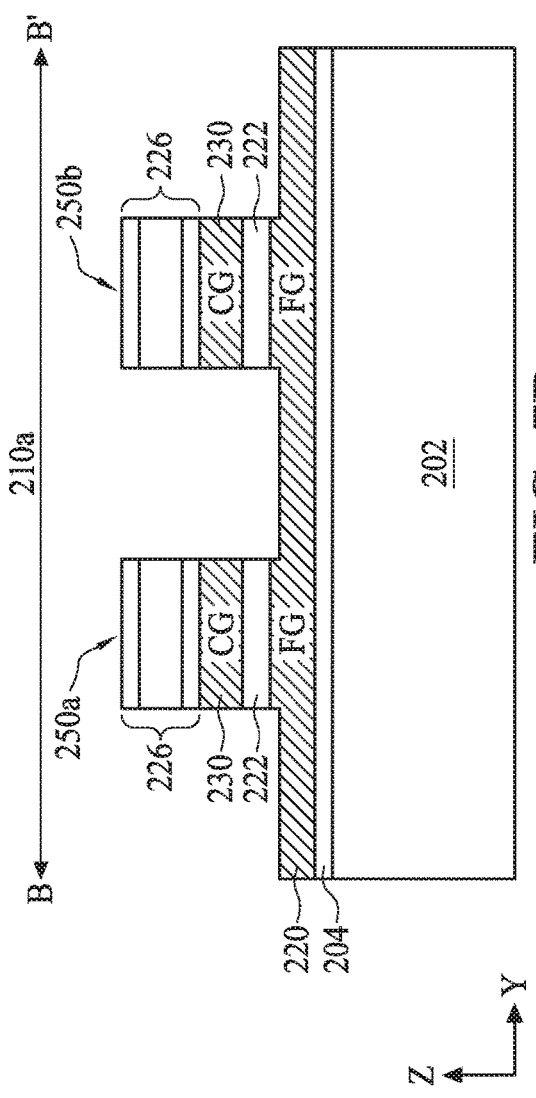
FIG. 7A
FIG. 7B

SEMICONDUCTOR STRUCTURE FOR MEMORY DEVICE AND METHOD FOR FORMING THE SAME

BACKGROUND

Non-volatile memory (NVM) is often used in various devices, such as computers. NVM is a type of memory storage that can retain data even while it is not powered on. NVM may be electrically addressed or mechanically addressed. Examples of electrically addressed NVM include flash memory, EPROMs, and EEPROMs. Functionality of NVM includes having information programmed into it, having information read from it, and/or having information erased from it.

On the other hand, continuing reduction of the minimum features produced by semiconductor processes and reduction in the size of the resulting devices has enabled continued improvements in speed, performance, density, and cost per unit function of integrated circuits and systems. As reliable memory becomes increasingly important for portable devices, such as mobile phones, tablet computers and other battery operated devices, the use of NVM is increasingly prevalent. Thus the need for efficiently manufactured, robust and cost effective NVM with high performance is increasing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 8 illustrate a series of cross-sectional views of a semiconductor structure for a memory device at various fabrication stages constructed according to aspects of the present disclosure in one or more embodiments.

DETAILED DESCRIPTION

Figure 1:
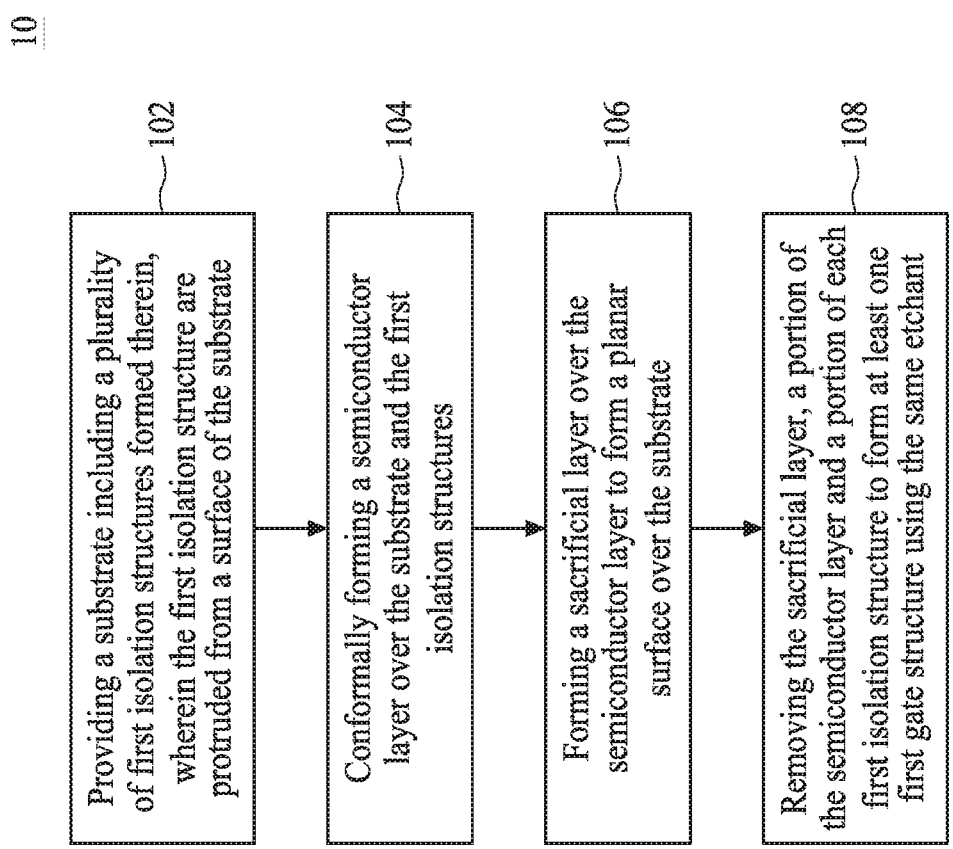
FIG. 1 is a flow chart representing a method for manufacturing a semiconductor structure for a memory device according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

During manufacturing semiconductor structures, sacrificial layers are usually required. For example, a sacrificial layer such as a bottom anti-reflective coating (BARC) layer is formed over a semiconductor layer for forming a floating gate. However, thickness uniformity of the BARC layer is poor due its high viscosity even a thickness of the BARC layer is over 1000 angstroms (Å). To achieve enough process window, processes for removing this thick sacrificial BARC layer is complicated and time-consuming Typically, two to three steps are involved. For example, a major etching for the sacrificial layer is performed with an etchant, a major etching for the semiconductor layer is subsequently performed with another etchant, and an over etching for the semiconductor layer is subsequently performed with still another etchant. Briefly speaking, different etching operations using different etchants are required. Furthermore, even though with such complicated process, the result of the sacrificial BARC removal is still poor: Surface roughness of the semiconductor layer after the sacrificial BARC removal is high. Even worse, it is found that the semiconductor layer may be left on regions where no semiconductor layer supposed to appear.

Present disclosure provides a semiconductor structure including lower roughness and a memory device including the semiconductor structure. The present disclosure further provides a method for manufacturing the semiconductor structure for the memory device, and the method includes simplified, low-cost and time-saving operations.

FIG. 1 is a flow chart representing a method for manufacturing a semiconductor structure for a memory device 10 according to aspects of the present disclosure. The method for manufacturing the semiconductor structure for the memory device 10 includes an operation 102, providing a substrate including a plurality of first isolation structures formed therein, wherein the first isolation structure are protruded from a surface of the substrate. The method for manufacturing the semiconductor structure for the memory device 10 further includes an operation 104, conformally forming a semiconductor layer over the substrate and the first isolation structures. The method for manufacturing the semiconductor structure for the memory device 10 further includes an operation 106, forming a sacrificial layer over the semiconductor layer to form a planar surface over the substrate. The method for manufacturing the semiconductor structure for the memory device 10 further includes an operation 108, removing the sacrificial layer, a portion of the semiconductor layer and a portion of each first isolation structure to form at least one first gate structure using the same etchant. The method for manufacturing the semiconductor structure for the memory device 10 will be further described according to one or more embodiments. It should be noted that the operations of the method for manufacturing the semiconductor structure for the memory device 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Referring to FIG. 2A and FIG. 2B, wherein FIG. 2B is a cross-sectional view along B-B' line of FIG. 2A. A substrate 202 is provided. In some embodiments of the present disclosure, the substrate 202 may be or include a silicon substrate. The substrate 202 may alternatively or additionally include other elementary semiconductor such as germanium (Ge) or diamond. The substrate 202 may also include a compound semiconductor including silicon carbide (SiC), gallium arsenic (GaAs), gallium phosphide (GaP), indium phosphide (InP), indium arsenide (InAs), and/or indium antimonide (InSb). The substrate 202 may include an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or indium arsenide phosphide (GaInAsP); or combinations thereon. The substrate 202 may include various p-type doped regions (not shown) and/or n-type doped regions (not shown) configured and coupled to form various devices and functional features. In some embodiments of the present disclosure, the substrate 202 includes an epitaxial layer overlying a bulk semiconductor. Doping features may be achieved using a process such as ion implantation or diffusion in various operations and techniques. Examples of n-type dopants that may be included in n-type doped regions include phosphorous (P), nitrogen (N), arsenic (As), antimony (Sb), and bismuth (Bi). Example of p-type dopants that may be included in p-type doped regions include boron (B), aluminum (Al)m gallium (Ga), indium (In), and thallium (Tl).

A first insulating layer 204 is formed over the substrate 202. The first insulating layer 204 can include silicon oxide (SiO), but not limited to this. A mask layer 206 is then formed over the first insulating layer 204. The mask layer 206 is typically formed of silicon nitride (SiN), but other materials are amenable. The mask layer 206 is then patterned and followed by etching the first insulating layer 204 and partially into the substrate 202 to form a plurality of trenches (not shown). The trenches are spaced to define diffusion regions (not shown) therebetween for the NVM cells and other devices/features. An insulating material is then formed to fill the trenches. In some embodiments of the present disclosure, the insulating material can be formed to fill the trenches and cover the mask layer 206, and a planarization is subsequently performed to expose the mask layer 206. Consequently, a plurality of first isolation structures 208 is formed in the substrate 202. In some embodiments of the present disclosure, the insulating material can include SiO, SiN or silicon oxynitride (SiON), but not limited to this. In some embodiments of the present disclosure, the first isolation structures 208 may include a multilayer structure such as a thermal oxide liner filled with SiN or SiO. Additionally, the substrate 202 can include a cell region 210a and a logic region 210b defined and electrically isolated from each other by some of the first isolation structures 208. The cell region 210a is defined to accommodate a plurality of memory cells and the logic region 210b is defined to accommodate at least one logic component.

Figure 3A:
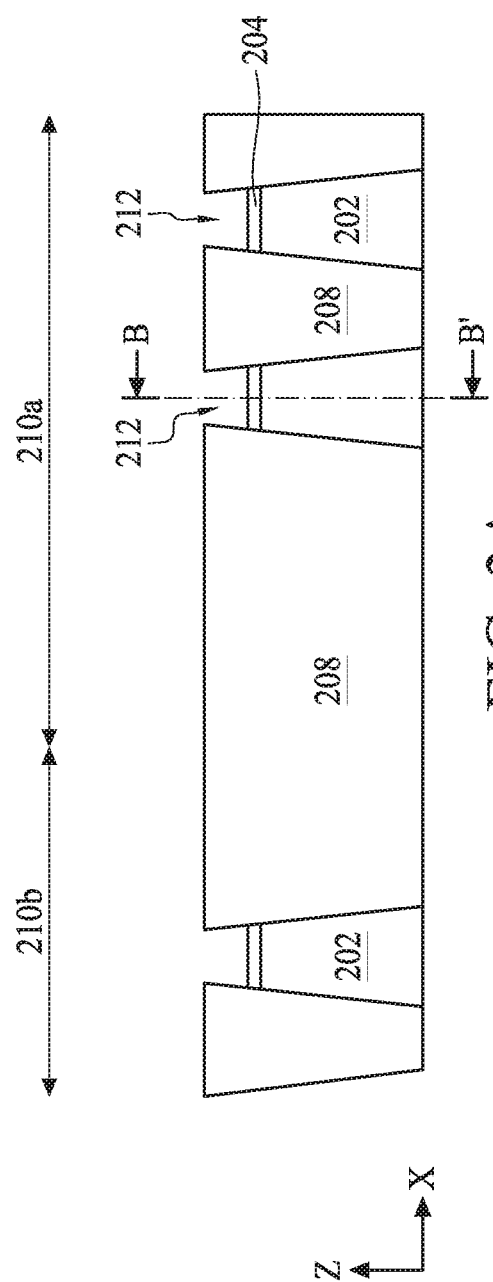
Figure 3B:
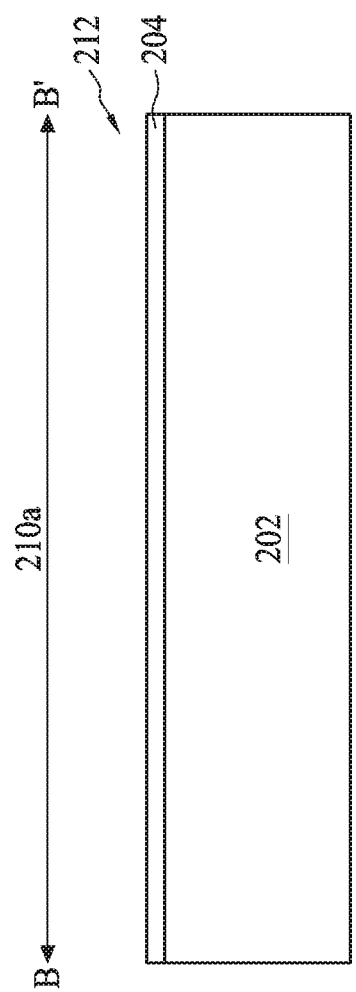

Referring to FIGS. 3A and 3B, wherein FIG. 3B is a cross-sectional view along B-B' line of FIG. 3A, the mask layer 206 is then removed from the substrate 202. In some embodiments of the present disclosure, a nitride stripping operation can be performed to remove the SiN mask layer 206. Consequently, a plurality of recesses 212 is created between the adjacent first isolation structures 208. As shown in FIG. 3A, the recesses 212 are formed abutting sidewalls of the first isolation structure 208. In other words, a substrate 202 including a plurality of first isolation structures 208 protruded from a surface of the substrate 202 is provided according to operation 102. Therefore, an uneven topography can be observed as shown in FIGS. 3A and 3B.

Figure 4A:
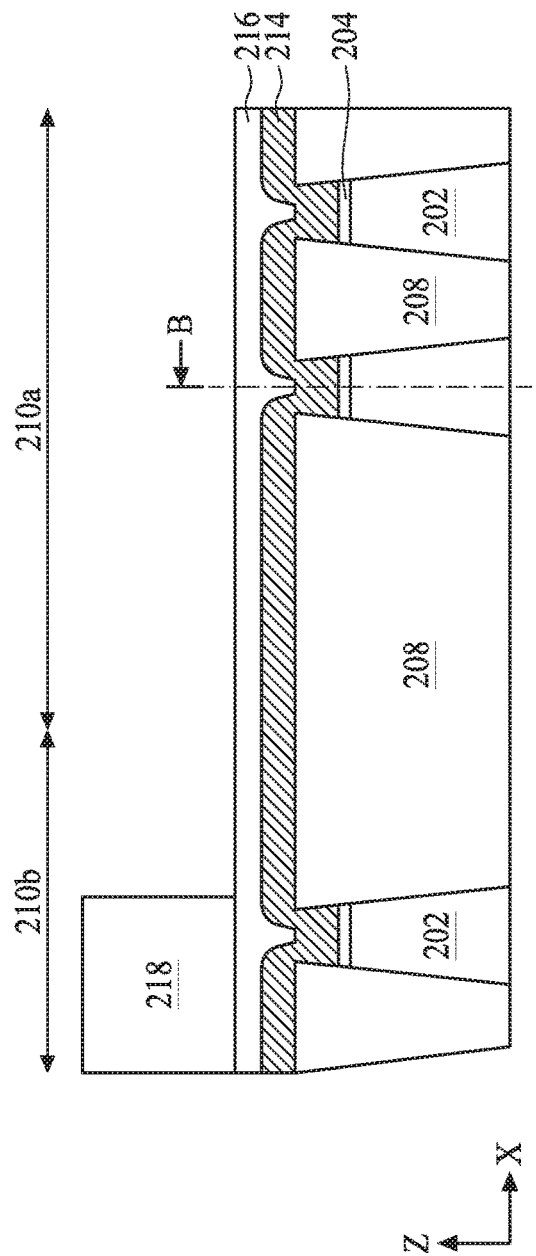
Figure 4B:
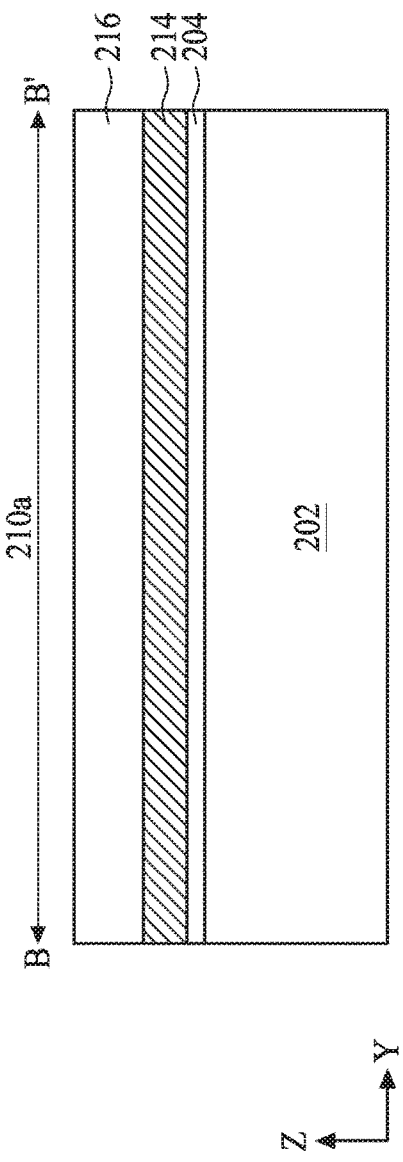

Referring to FIGS. 4A and 4B, wherein FIG. 4B is a cross-sectional view along B-B' line of FIG. 4A, a semiconductor layer 214 is conformally formed over the substrate 202 and the first isolation structures 208 according to operation 104. The semiconductor layer 214 can include polysilicon, doped polysilicon, and combinations thereof. As shown in FIGS. 4A and 4B, the semiconductor layer 214 is formed to fill the recesses 212 and cover the first isolation structures 208. Furthermore, since the semiconductor layer 214 is conformally formed, the semiconductor layer 214 includes an uneven topography as shown in FIGS. 4A and 4B. The semiconductor layer 214, as an as-grown film, includes a first arithmetical mean roughness (Ra) value and a first root-mean-square roughness (Rq) value. It should be understood that the surface roughness can be defined as an arithmetic mean Ra and a root mean square Rq. The arithmetic mean Ra indicates an arithmetic mean of each peak (according to highest and lowest parts of the surface of the electrode), and the root mean square Rq indicates rms (root mean square). Simply speaking, the lower Ra and Rq values indicate a more uniform surface. In some embodiments of the present disclosure, the first Ra value of the semiconductor layer 214 can be about 1.3 and the first Rq value of the semiconductor layer 214 can be about 1.6.

Still referring to FIGS. 4A and 4B, a fluidic sacrificial material is applied over the substrate 202 after forming the semiconductor layer 214. The fluidic sacrificial material includes a viscosity ranged from about 0.8 centipoise (cp) to about 1.8 cp. In some embodiments of the present disclosure, the fluidic sacrificial material includes a viscosity lower than about 1.2 cp. In some embodiments of the present disclosure, the fluidic sacrificial material can include at least aromatic resin and propylene glycol monomethyl ether acetate (PGMEA), but not limited to this. Next, the fluidic sacrificial material is solidified to form a sacrificial layer 216 over the semiconductor layer 214 according to operation 106. And a thickness of the sacrificial layer 216 is ranged from about 100 nanometer (nm) to about 200 nm. Because the viscosity of the fluidic sacrificial material is relatively low, the sacrificial layer 216 forms a planar surface over the substrate 202. After forming the sacrificial layer 216, a patterned photoresist layer 218 is formed over the substrate 202. The patterned photoresist layer 218 is formed to cover a portion of the substrate 202. For example but not limited to, the patterned photoresist layer 218 can be formed to cover a portion of the substrate 202 in the logic region 210b while the cell region 210a is totally exposed from the patterned photoresist 218 as shown in FIGS. 4A and 4B.

Figure 5A:
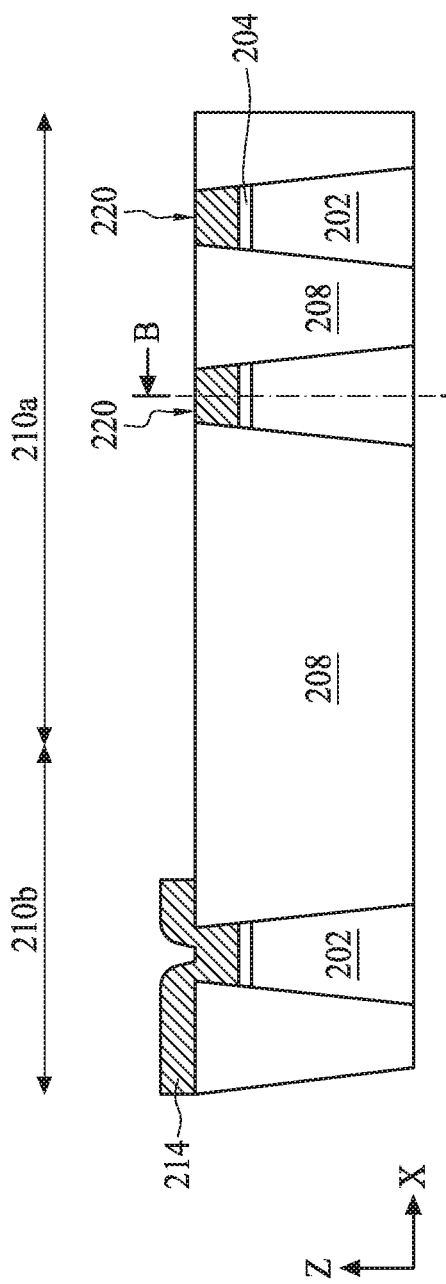
Figure 5B:
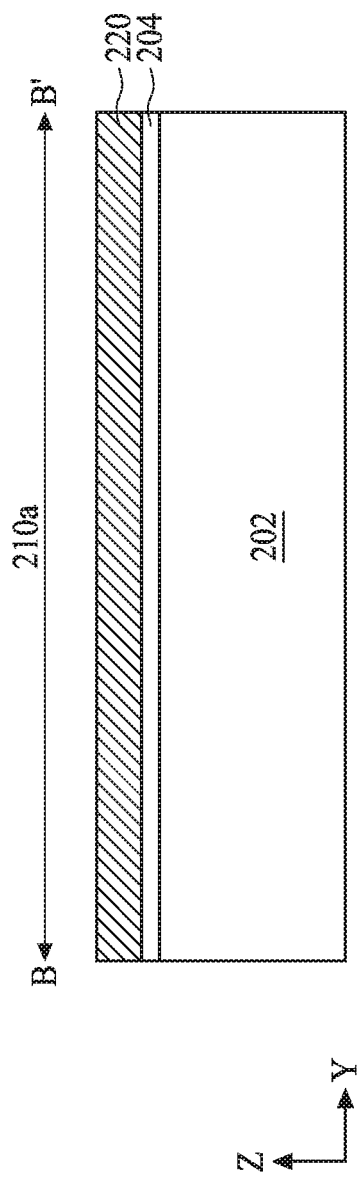

Referring to FIGS. 5A and 5B, wherein FIG. 5B is a cross-sectional view along B-B' line of FIG. 5A, according to operation 108. In operation 108, the sacrificial layer 216 is removed. Moreover, a portion of the semiconductor layer 214 and a portion of each first isolation structure 208 are removed to form at least one first gate structure 220 using a same etchant in the same operation. In some embodiments of the present disclosure, an etching operation such as, for example but not limited to, an etching back operation with low selectivity to the sacrificial layer 216, the semiconductor layer 214 and the first isolation structures 208 can be performed. In other words, an etchant having substantially the same etching rates of the sacrificial layer 216, the semiconductor layer 214 and the first isolation structures 208 can be used in the etching operation. In some embodiments of the present disclosure, the etchant includes a fluorine-based etchant such as, for example but not limited to, tetrafluoromethane ($CF_4$). It should be noted that the etchant has low selectivity to the sacrificial layer 216, the semiconductor layer 214 and the first isolation structures 208, therefore the sacrificial layer 216, the portion of the semiconductor layer 214 and the portion of each first isolation structure 208 can be removed in a single-stepped etching without changing etchants. More importantly, the sacrificial layer 216 is entirely removed from the substrate 202 while the semiconductor layer 214 and the first isolation structures 208 are partially removed by the same etchant. In some embodiments of the present disclosure, the sacrificial layer 216 is removed to expose a surface of the semiconductor layer 214 by using the etchant, a portion of the semiconductor layer 214 is subsequently removed to expose surfaces of the first isolation structures 208 by using the same etchant, and both the semiconductor layer 214 and the first isolation structures 208 are subsequently removed still by the same etchant. Consequently, portions of the semiconductor layer 214 remained in the recesses 212 are referred to as first gate structures 220. As shown in FIGS. 5A and 5B, two opposite sidewalls of the first gate structures 212 are adjacent sidewalls of the first isolation structures 208. And top surfaces of the first gate structures 220 and top surfaces of the first isolation structures 208 in the cell region 210a are both exposed after removing the sacrificial layer 216. In some embodiments of the present disclosure, the first insulating layer 204 is sandwiched between each first gate structure 220 and the substrate 202. In some embodiments of the present disclosure, the first insulating layer can be replaced with another insulating material, and the semiconductor layer 214 is formed over the insulating material. In some embodiments of the present disclosure, the first gate structures 220 serve as floating gates for an NVM device, which will be further described according to one or more embodiments. Additionally, the semiconductor layer 214 may remain over the substrate 202 and the first isolation structures 208 in the logic region 210b as shown in FIG. 5A. The patterned photoresist layer 218 is removed after forming the first gate structures 220.

Furthermore, the first gate structures 220 include a second Ra value and a second Rq value. It should be noted that the second Ra value of the first gate structures 220 is smaller than the first Ra value of the semiconductor layer 214, and the second Rq value of the first gate structures 220 is smaller than the first Rq value of the semiconductor layer 214. In some embodiments of the present disclosure, the second Ra value is lower than 0.4 nm and the second Rq value is lower than 0.5 nm. In some embodiments of the present disclosure, the second Ra value can be about 0.277 nm, and the second Rq value can be about 0.349 nm.

Referring to FIGS. 6A and 6B, wherein FIG. 6B is a cross-sectional view along B-B' line of FIG. 6A, a second insulating layer 222 is conformally formed over the substrate 202 after forming the first gate structures 220. The second insulating layer 222 is formed to cover the first gate structures 220 and the first isolation structures 208. In some embodiments of the present disclosure, the second insulating layer 222 is a multi-layer such as, for example but not limited to, an oxide-nitride-oxide (ONO) multi-layer. As shown in FIGS. 6A and 6B, another semiconductor layer 224 is then conformally formed over the substrate 202. The semiconductor layer 224 is formed to cover the second insulating layer 222. In some embodiments of the present disclosure, the semiconductor layer 224 can include polysilicon, doped polysilicon, and combinations thereof. Thereafter, a hard mask layer 226 is stacked over the semiconductor layer 224. In some embodiments of the present disclosure, the hard mask layer 226 can be a multilayer structure that includes nitride-oxide-nitride (NON) dielectric materials, but not limited to this.

Referring to FIGS. 7A and 7B, wherein FIG. 7B is a cross-sectional view along B-B' line of FIG. 7A, the hard mask layer 226 is patterned and followed by an etching process performed through the patterned hard mask layer 226, the second semiconductor layer 224, the second insulating layer 222 and the first gate structures 220. Consequently, second gate structures 230 are formed over the first gate structures 220 and the second insulating layer 222. The second insulating layer 222 sandwiched between the first gate structure 220 and the second gate structure 230 serves as an inter-poly dielectric (IPD). The first gate structure 220 includes a surface facing the second insulating layer 222, and the surface includes the Ra lower than 0.4 nm and the Rq lower than 0.5 nm as mentioned above. More importantly, at least one pair of gate stacks 250a and 250b is formed over the substrate 202 in the cell region 210b. Each of the gate stack 250a or 250b includes the first gate structure 220 serving as the floating gate FG, the second gate structure 230 serving as the control gate CG, the first insulating layer 204 sandwiched between the substrate 202 and the first gate structure 220 (the floating gate FG), and the second insulating layer 222 sandwiched between the first gate structure 220 (the floating gate FG) and the second gate structure 230 (the control gate CG).

Additionally, in some embodiments of the present disclosure, a dummy structure 228 can be formed in between the cell region 210a and the logic region 210b. As shown in FIGS. 7A and 7B, since the semiconductor layer 214 is removed from the surface of the substrate 202 and the surface of the first isolation structures 208 in the cell region 210a and portion of the logic region 210b, the second insulating layer 222 of the dummy structure 228 directly contacts the substrate 202.

Figure 8:
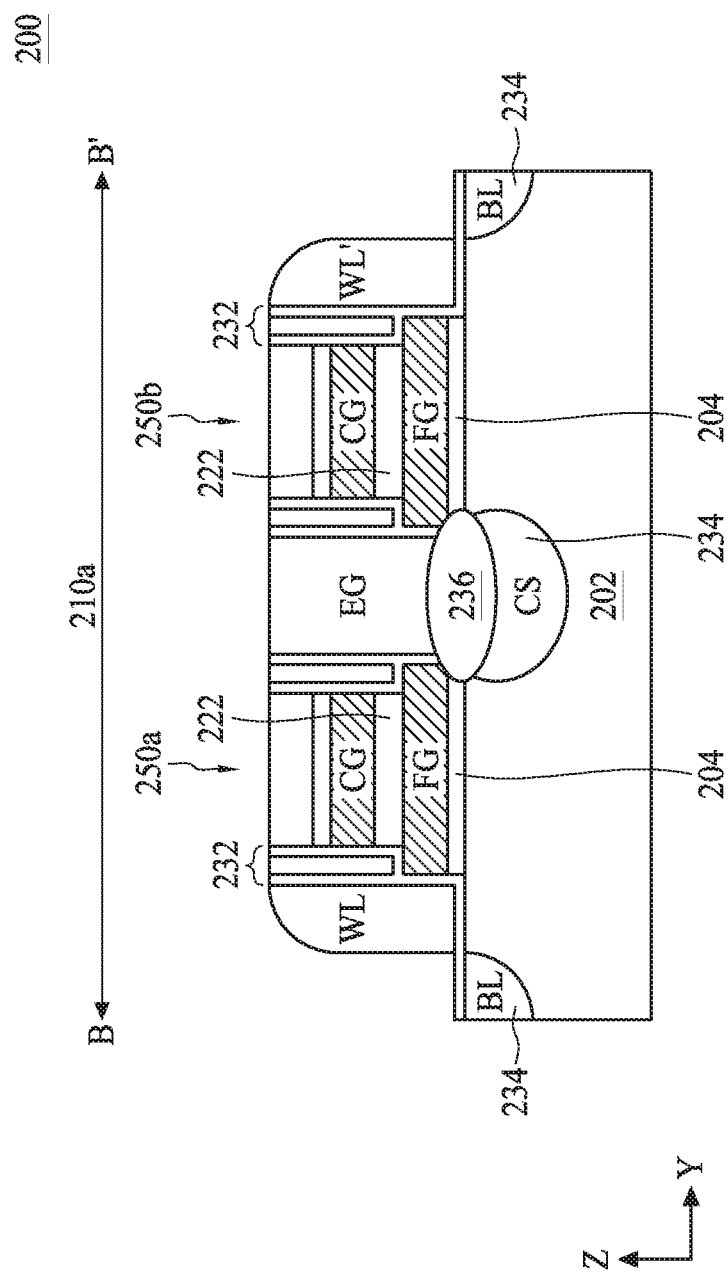

Referring to FIG. 8, spacers 232 are then formed on sidewalls of the gate stacks 250a and 250b. The spacers 232 can be formed by conformally forming an intermediate dielectric layer over sidewalls of the control gates CG, the second insulating layer 222, and the floating gates FG. The spacers 232 also are formed over the hard mask layer 226 and portions of the floating gates FG as shown in FIG. 8. In some embodiments of the present disclosure, the spacers 232 respectively include a multi-layered structure formed by multiple operation process. For example but not limited to, the spacers 232 can be an oxide-nitride-oxide (ONO) multi-layered structure.

Still referring to FIG. 8. A plurality of source/drain regions 234 embedded in the substrate 202 and spaced apart from each other is then formed in the substrate 202. In some embodiment of the present disclosure, the source/drain regions 234 are formed by masking portions of the substrate 202, and implanting ions into the substrate 202 to form the source/drain regions 234. In some embodiments of the present disclosure, the source/drain region 234 may be portions of an epitaxy layer such as a silicon epitaxy layer formed by epitaxy processing. In some embodiments of the present disclosure, liners can be formed over sidewalls of the gate stacks 250a and 250b before implantation. One source region 234 embedded in between the two gate stacks 250a and 250b serves as a common source region CS while two drain regions 234 formed at two opposite sides of the pair of gate stacks 250a/250b serve as bit lines BLs. In other words, the pair of gate stacks 250a/250b and the common source region CS are arranged between the two bit lines BLs. Further, channel regions are defined between the bit lines BLs and the common source/drain region CS.

Still referring to FIG. 8, a second isolation structure 236 is formed over the common source region CS. The second isolation structure 236 may be a field oxide (FOX) structure formed by a series of steps including: using a patterned mask to expose the common source region CS, oxidizing the substrate, other suitable processes, and combinations thereof. After forming the second isolation structure 236, an erase gate EG and word lines WL/WL' can be formed over the substrate 202. The erase gate EG and the word lines WL/WL' can include polysilicon, doped polysilicon, or combination thereof. In some embodiments of the present disclosure, the erase gate EG and the word lines WL/WL' can include metal such as Al, Cu, W, Ti. Ta, TiN, TaN, NiSi, CoSi, other suitable conductive materials, or combinations thereof. In some embodiments of the present disclosure, the erase gate EG and the word lines WL/WL' can be multi-player structure and may be formed in a multiple operation process. In some embodiments of the erase gate EG and the word lines WL/WL' may include a layer of silicide, or any other material suitable to reduce resistance.

The erase gate EG is formed on the second isolation structure 236, and electrically isolated from the common source region CS by the second isolation structure 236. In some embodiments of the present disclosure, an erase gate dielectric layer (not shown) can be disposed between the erase gate EG and the second isolation structure 236. The word lines WL/WL' respectively are disposed adjacent to sidewalls of the gate stacks 250a/250b and over the substrate 202. As shown in FIG. 8, the gate stack 250a is between the erase gate EG and the word line WL, and the gate stack 250b is between the erase gate EG and the word line WL'. And the word lines WL/WL' are electrically isolated from the substrate 202 by a word line dielectric layer. The erase gate dielectric layer and the word line dielectric layer can include SiO. Alternatively, the erase gate dielectric layer and the word line dielectric layer can include high dielectric-constant (high-k) materials, SiON, other suitable materials or combination thereof. Further, the erase gate dielectric layer and the word line dielectric layer may include a multilayer structure. Accordingly, a split-gate NVM device 200 is obtained.

It will be appreciated that in the forgoing method, the sacrificial layer provides a planar surface that improves operation efficiency and etching back result. As mentioned above, the surface of the first gate electrode includes lower Rq and lower Ra that indicate an even and uniform surface. More importantly, the sacrificial layer, the portion of the semiconductor layer, and the portion of the first isolation structures are removed using the same etchant. Accordingly, operation for removing the sacrificial layer, the portion of the semiconductor layer and the portion of the first isolations structures is simplified. And since one etchant is used in the removal of the abovementioned three layers, process cost and process time are both reduced, and throughput is improved.

According to one embodiment of the present disclosure, a method for forming a semiconductor structure is provided. The method includes providing a substrate including a plurality of first isolation structures formed therein, wherein the first isolation structures are protruded from a surface of the substrate; conformally forming a semiconductor layer over the substrate and the first isolation structures; forming a sacrificial layer over the semiconductor layer to form a planar surface over the substrate; and removing the sacrificial layer, a portion of the semiconductor layer and a portion of each first isolation structure to form at least one first gate structure using a same etchant.

According to another embodiment, a semiconductor structure for a memory device is provided. The semiconductor structure includes substrate, a plurality of isolation structures in the substrate, a first gate structure over the substrate, a second gate structure over the first gate, a first insulating layer sandwiched between the substrate and the first gate structure, and a second insulating layer sandwiched between the first gate structure and the second gate structure. The first gate structure includes a surface facing the second insulating layer, and the surface includes an arithmetical mean roughness (Ra) value lower than 0.4 nanometers (nm) and a root-mean-square roughness (Rq) value lower than 0.5 nm.

According to one embodiment of the present disclosure, a memory device is provided. The memory device includes a substrate, a gate stack over the substrate, a source region and a drain region spaced apart from each other, and an erase gate over the source region. The gate stack includes a floating gate over the substrate, a control gate over the floating gate, and an insulating layer between the floating gate and the control gate. The floating gate includes a surface facing the insulating layer, and the surface includes an Ra value lower than 0.4 nm and a Rq value lower than 0.5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for a memory device comprising:
   a substrate;
   a first isolation structure in the substrate;
   a plurality of second isolation structures in the substrate;
   a first gate structure over the substrate;
   a second gate structure over the first gate structure;
   a source region in the substrate;
   a first insulating layer sandwiched between the substrate and the first gate structure; and
   a second insulating layer sandwiched between the first gate structure and the second gate structure,
   wherein the first gate structure comprises a surface facing the second insulating layer, the surface comprises an arithmetical mean roughness (Ra) value lower than 0.4 nanometers (nm) and a root-mean-square roughness (Rq) value lower than 0.5 nm, the surface of the first gate structure and top surfaces of the second isolation structures are substantially at a same level, the source region is entirely covered by the first isolation structure, a portion of the second insulating layer is in contact with at least one of the second isolation structures, the second insulating layer has a first portion over and in contact with the first gate structure, the second insulating layer has a second portion over and in contact with the at least one of the second isolation structures, and the first portion of the second insulating layer and the second portion of the second insulating layer are substantially at a same level.

2. The semiconductor structure of claim 1, wherein the Ra value is about 0.277 nm, and the Rq value is about 0.349 nm.

3. The semiconductor structure of claim 1, wherein two opposite sidewalls of the first gate structure are adjacent to the second isolation structures.

4. The semiconductor structure of claim 1, wherein the second insulating layer comprises an oxide/nitride/oxide (ONO) multi-layer.

5. The semiconductor structure of claim 1, further comprising a drain region in the substrate, and the source region and the drain region being spaced apart from each other.

6. A memory device comprising:
   a substrate;
   a gate stack over the substrate, the gate stack comprising:
      a floating gate over the substrate, wherein the floating gate comprises a semiconductor layer;
      a control gate over the floating gate; and
      an insulating layer between the floating gate and the control gate;
   a source region and a drain region spaced apart from each other;
   an erase gate over the source region;
   a first isolation structure between the source region and the erase gate; and
   a plurality of second isolation structures in the substrate,
   wherein the semiconductor layer of the floating gate comprises a top surface facing the insulating layer and a bottom surface opposite to the top surface, the top surface of the semiconductor layer comprises an arithmetical mean roughness (Ra) value lower than 0.4 nanometers (nm) and a root-mean-square roughness (Rq) value lower than 0.5 nm, the top surface of the semiconductor layer of the floating gate and top surfaces of the second isolation structures are substantially at a same level, the bottom surface of the semiconductor layer of the floating gate is lower than a topmost surface of the first isolation structure, and a portion of the insulating layer is in contact with at least one of the second isolation structures.

7. The memory device of claim 6, wherein the Ra value is about 0.277 nm, and the Rq value is about 0.349 nm.

8. The memory device of claim 6, further comprising a word line over the substrate, wherein the gate stack is between the erase gate and the word line.

9. The memory device of claim 6, wherein two opposite sidewalls of the floating gate are adjacent to the second isolation structures.

10. The memory device of claim 6, wherein the erase gate is electrically isolated from the source region by the first isolation structure.

11. The memory device of claim 6, wherein the insulating layer comprises an oxide/nitride/oxide (ONO) multi-layer.

12. The memory device of claim 6, wherein the floating gate is isolated from the substrate.

13. A memory device comprising:
   a substrate;
   a first gate stack and a second gate stack over the substrate, the first gate stack and the second gate stack respectively comprising:
      a floating gate over the substrate, wherein the floating gate comprises a semiconductor layer;
      a control gate over the floating gate; and
      an insulating layer between the floating gate and the control gate;
   a source region between the first gate stack and the second gate stack;
   two drain regions spaced apart from each other by the first gate stack, the source region and the second gate stack;
   an erase gate over the source region;
   a first isolation structure between the source region and the erase gate; and
   a second isolation structure in the substrate,
   wherein the semiconductor layer of the floating gates of the first gate stack and the second gate stack comprises a top surface facing the insulating layer and a bottom surface opposite to the top surface, the top surface of the semiconductor layer comprises an arithmetical mean roughness (Ra) value lower than 0.4 nanometers (nm) and a root-mean-square roughness (Rq) value lower than 0.5 nm, the top surface of the semiconductor layer of the floating gates and top surfaces of the second isolation structures are substantially at a same level, the bottom surface of the semiconductor layer of the floating gates is lower than a topmost surface of the first isolation structure, and a portion of the insulating layer is in contact with the second isolation structure.

14. The memory device of claim 13, wherein the Ra value is about 0.277 nm, and the Rq value is about 0.349 nm.

15. The memory device of claim 13, further comprising a first word line and a second word line over the substrate, wherein the first gate stack is between the erase gate and the first word line, and the second gate stack is between the erase gate and the second word line.

16. The memory device of claim 13, wherein two opposite sidewalls of the floating gates of the first gate stack and the second gate stack are adjacent to the second isolation structures.

17. The memory device of claim 13, wherein the insulating layers of the first gate stack and the second gate stack comprise an oxide/nitride/oxide (ONO) multi-layer.

18. The memory device of claim 13, wherein the erase gate is electrically isolated from the source region by the first isolation structure.

19. The memory device of claim 13, wherein the floating gates of the first gate stack and the second gate stack are isolated from the substrate.

20. The memory device of claim 15, wherein the first word line is separated from the first gate stack, and the second word line is separated from the second gate stack.

* * * * *